United States Patent
Kuehnel

(10) Patent No.: US 7,400,194 B2
(45) Date of Patent: Jul. 15, 2008

(54) METHOD OF AMPLIFYING A DIGITAL SIGNAL AND DEVICE THEREFOR

(75) Inventor: Richard John Kuehnel, Stuttgart (DE)

(73) Assignee: The United States of America as represented by the National Security Agency, Washington, DC (US)

( * ) Notice: Subject to any disclaimer, the term of this patent is extended or adjusted under 35 U.S.C. 154(b) by 140 days.

(21) Appl. No.: 11/449,469

(22) Filed: Jun. 8, 2006

(65) Prior Publication Data

US 2007/0285163 A1    Dec. 13, 2007

(51) Int. Cl.
*H03F 3/217* (2006.01)
(52) U.S. Cl. .................... 330/251; 330/207 A
(58) Field of Classification Search ............ 330/207 A, 330/251
See application file for complete search history.

(56) References Cited

U.S. PATENT DOCUMENTS

| 6,166,595 | A  | * | 12/2000 | Moldsvar et al. ............ 330/9 |
| 6,445,247 | B1 | * | 9/2002  | Walker ........................ 330/10 |
| 6,888,403 | B2 |   | 5/2005  | Cho et al. |

* cited by examiner

*Primary Examiner*—Steven J Mottola
(74) *Attorney, Agent, or Firm*—Eric Froehlich

(57) ABSTRACT

An efficient method of amplifying a digital signal with reduced electromagnetic interference is disclosed. The invention applies an average amplitude detector to the input signal to control the clock frequency of a pseudo-random number generator so that the clock signal decreases when the average amplitude of the signal increases. The input signal and the pseudo-random number generator are compared to generate a control signal for a switching power amplifier followed by a low-pass filter. When the average amplitude of the input signal falls below a pre-determine threshold, the switching amplifier is placed in a sleep mode.

3 Claims, 4 Drawing Sheets

METHOD OF AMPLIFYING A DIGITAL SIGNAL AND DEVICE THEREFOR

FIELD OF THE INVENTION

The present invention relates, in general, to amplifiers, and, in particular to a switching power amplifier.

BACKGROUND OF THE INVENTION

It is widely known that a transistor draws very little power when it is operating fully switched "on" or fully switched "off." Small, battery-operated audio power amplifiers, such as those found in MP3 players, and hearing aids, require this efficiency to obtain sufficient battery life, small size, lower weight, and reduced cost.

An analog power amplifier is usually operating between these two extremes and wastes power by creating wasted heat. To solve this problem, a switching amplifier, or "class-D" amplifier is used. The switching amplifier operates in on/off mode, which generates a series of pulses whose average value is proportional to the amplitude of the input signal at that time. The output passes through a low pass filter to remove high frequency switching noise.

The most common way to switch the power amplifier "on" and "off" is by using a pulse width modulator, as shown in FIG. 1. A typical pulse width modulator 12 includes a ramp generator 14 to generate a saw-tooth or triangular waveform that is compared to the input analog signal 16 at a comparator 18. When the input is greater than the ramp generator output the power amplifier is turned "on," otherwise the amplifier is turned "off." The result is a series of high frequency pulses whose width varies with the input signal. When the input voltage is high, the pulses are very wide, whereas when the input is low, they are very narrow. There is a substantial amount of electromagnetic interference (EMI) generated at the pulse repetition frequency, which is equal to the frequency of the ramp generator. The EMI must be shielded from external circuits or devices in the vicinity.

A power transistor in a class D amplifier is relatively inefficient during the time that it switches from "on" to "off" or vice versa. During each cycle of the ramp oscillator the transistor switches twice: once to "on" and once to "off." When using a pulse width modulator, the higher the oscillator frequency, the higher the switching rate, and the higher the losses.

U.S. Pat. No. 6,888,403 entitled "PULSE WIDTH MODULATION TYPE AUDIO AMPLIFIER HAVING VARIABLE AVERAGE SWITCHING FREQUENCY" discloses a method of mitigating these losses by using a bandwidth detector to determine the minimum possible switching rate. As shown in FIG. 2, the frequency of the ramp generator is controlled by a frequency controller 22, which uses a bandwidth detector 24 to select an appropriate switching rate. For low-bandwidth audio signals, like bass signals for a subwoofer, a low switching rate is used. The circuit shown in FIG. 2 is not power efficient because the entire circuit is active all the time, even when no input signal is present. The circuit also produces electromagnetic interference that is concentrated into a very narrow frequency range and thus much harder to shield. The present invention is not lacking in these regards. U.S. Pat. No. 6,888,403 is hereby incorporated by reference into the specification of the present invention.

There exists a need for a simple, easy to construct, efficient power amplifier that reduces electromagnetic interference.

SUMMARY OF THE INVENTION

It is an object of the present invention to provide a method of and device for amplifying a digital signal that increases efficiency and has reduced EMI.

The first step of the present method is receiving a digital signal.

The second step in the present method is generating a pseudo-random number. The pseudo-random number is generated every clock cycle of a variable clock, wherein the frequency of the variable clock is varied in accordance with the average amplitude of the received digital signal.

The third step is comparing the received digital signal with the pseudo-random number.

In the fourth step, if the digital signal is greater than or equal to the pseudo-random number, the amplifier is switched on, otherwise the amplifier is switched off.

The fifth step of the present method is filtering the output of the amplifier, preferably using a low pass filter.

The sixth step of the present method is transmitting the filtered output to a transducer.

In seventh, and final, step of the present method, if the amplitude of the received digital signal is close to zero for a user-definable period of time, turning the amplifier off.

The present invention provides an all-digital power amplifier that applies an average amplitude detector to the input signal to control the clock frequency of a pseudo-random number generator so that the clock signal decreases when the average amplitude of the signal increases. The input signal and the pseudo-random number generator are compared to generate a control signal for a switching power amplifier followed by a low-pass filter. When the average amplitude of the input signal falls below a predetermined threshold, the switching amplifier is placed in a sleep mode.

DETAILED DESCRIPTION

A more efficient audio power amplifier with reduced electromagnetic interference has important applications in consumer electronics, such as MP3 players and hearing aids. Increased efficiency translates into greater battery life and/or fewer batteries, and reduced EMI results in the ability to employ the device without additional shielding.

As described above, it is widely known that a transistor draws very little power when it is operating fully switched "on" or fully switched "off." In an analog power amplifier, however, it is usually operating between these two extremes and wastes power by creating wasted heat. For this reason, so-called "Class D" amplifiers have become popular. A Class D amplifier switches the output "on" and "off" at a very high rate such that the output signal averages out to the desired analog voltage. The output passes through a low-pass filter to eliminate the high-frequency switching noise and is then applied to the loudspeaker or earphone.

Figure 1:
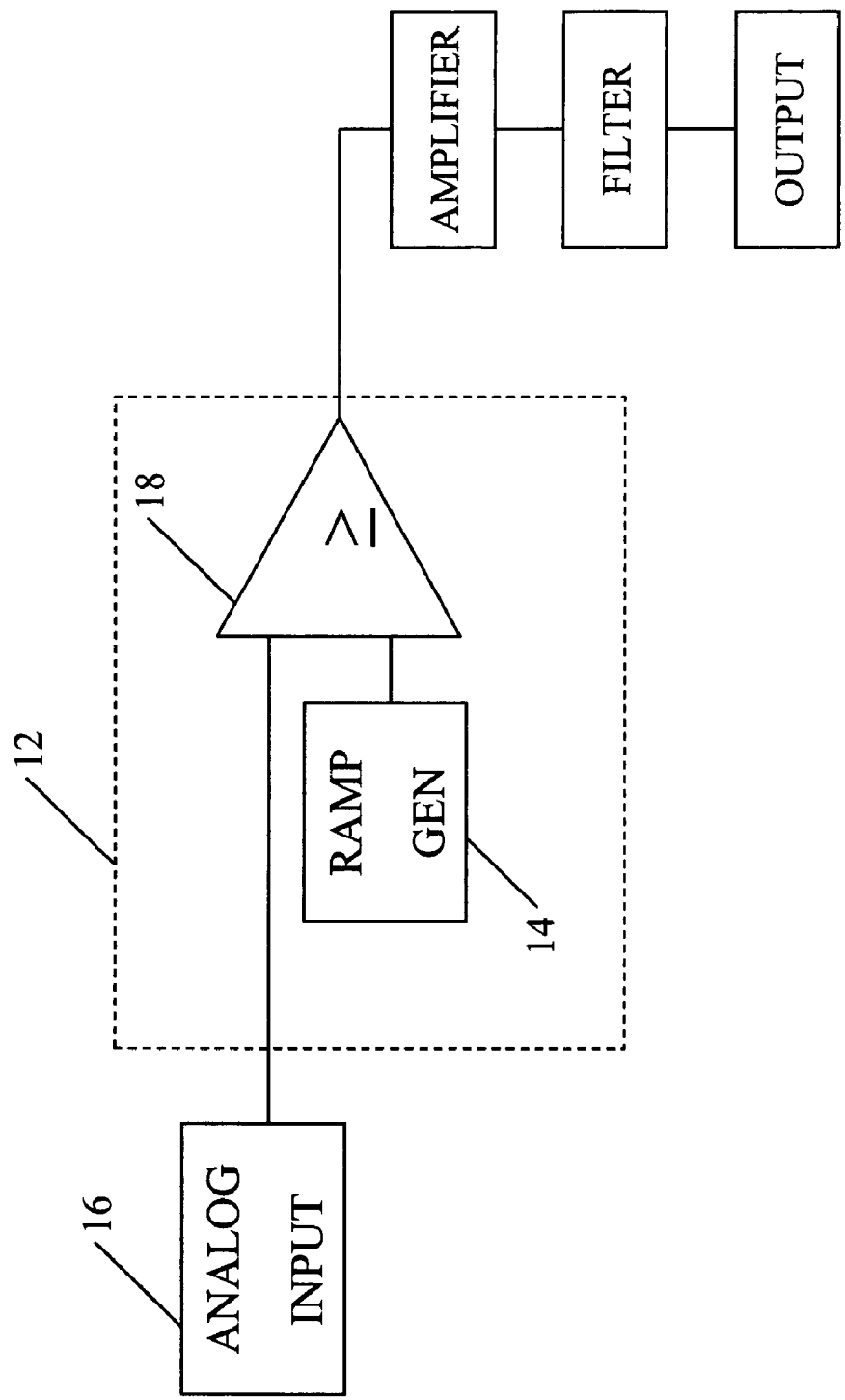
FIG. 1 is a simplified schematic of a typical class-D amplifier.
Figure 2:
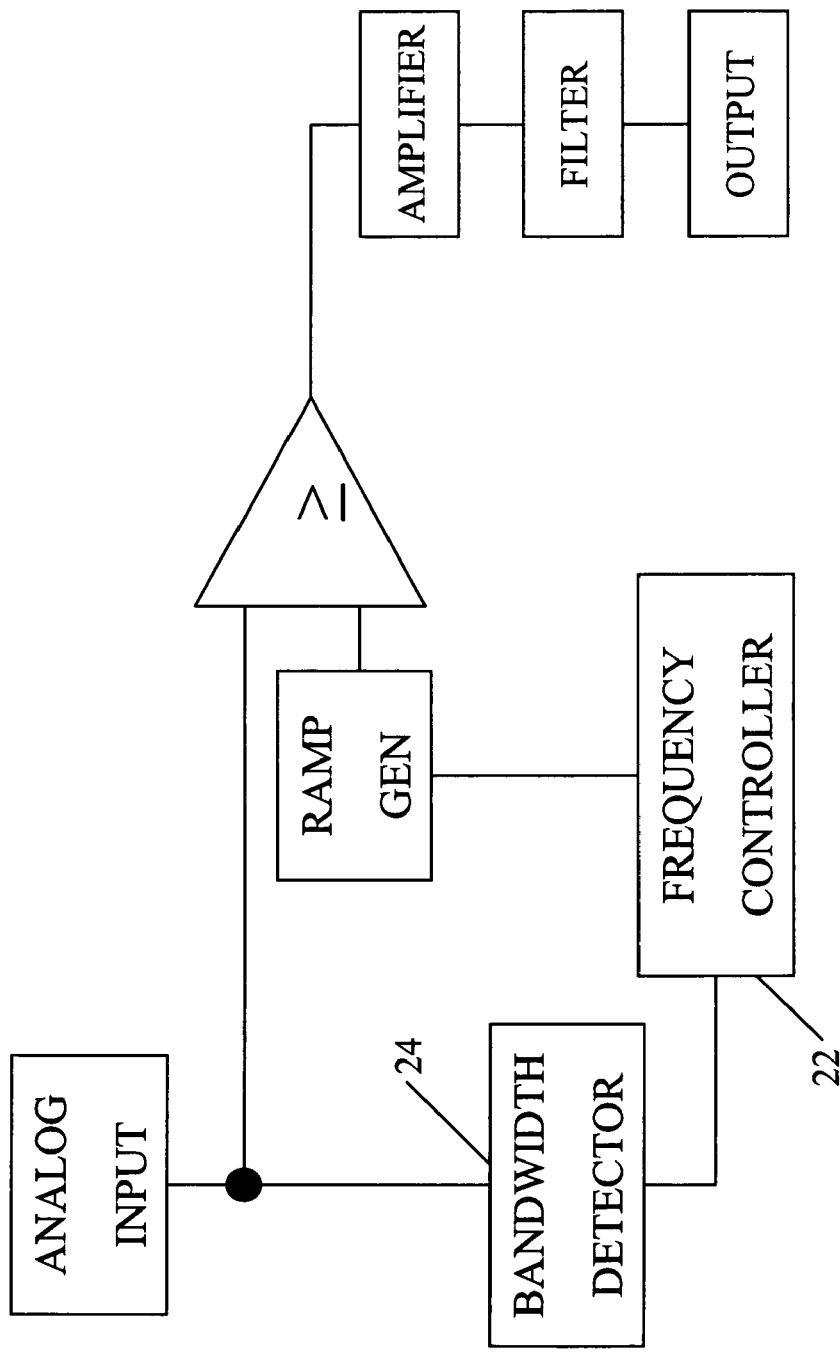
FIG. 2 is a simplified schematic of the prior art improvement of the amplifier shown in FIG. 1.
Figure 3:
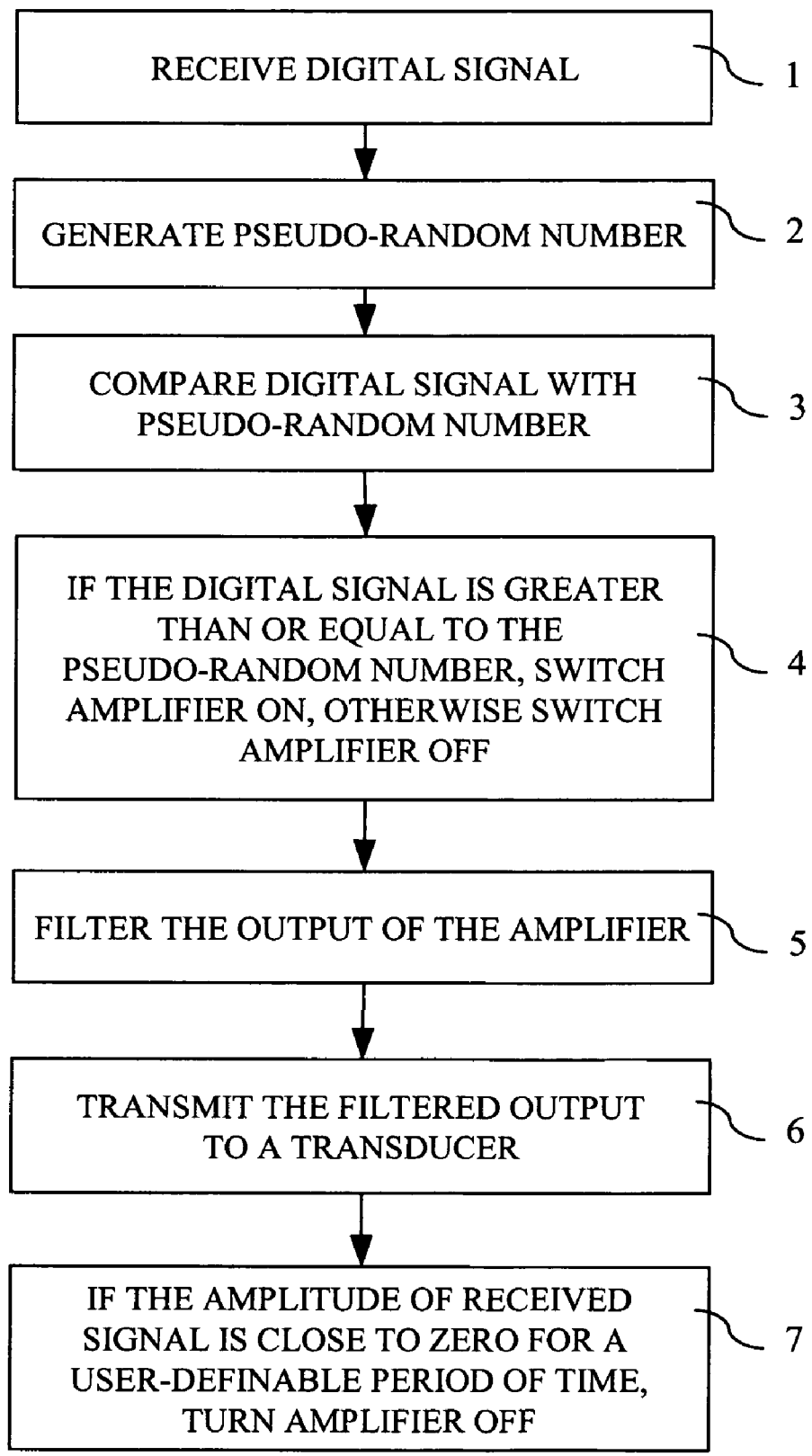
FIG. 3 is a flowchart of the present invention.

FIG. 3 is a flowchart of the steps of the present invention.

The first step 1 of the present method is receiving a digital signal.

The second step 2 in the present method is generating a pseudo-random number. The pseudo-random number is generated every clock cycle of a variable clock, whereby the frequency of the variable clock is varied in accordance with the average amplitude of the received digital signal.

The least power efficient state of the amplifier is with a very low amplitude input signal, for which there is close to a 50-percent chance that the amplifier will be switched "on" or "off" at each possible switching time. In this case, the amplifier switches much more often than when the input is at the extremes of its range and it generates more switching noise. Moreover, the switching noise (which when heard sounds like a constant hissing sound, so-called "white" noise, in the background) is more perceptible when there is very little input signal. For that reason the present invention incorporates an average amplitude detector. For high average amplitudes, the clock speed of the pseudo-random number generator is decreased for greater efficiency. In this case, more white noise is generated in the audio range but because of the high signal level, it is not perceived by the listener. As the input signal amplitude decreases, the clock rate is increased, reducing the amount of white noise within the audio range so that it becomes imperceptible to the listener.

The third step 3 in the present invention is comparing the received digital signal with the pseudo-random number. Normally this will be done with a comparator circuit.

In the fourth step 4 of the present method, if the digital signal is greater than or equal to the pseudo-random number, the amplifier is switched on, otherwise the amplifier is switched off.

The amplifier is mostly "on" when the input to the comparator is high and mostly "off" when the input is low. During each clock cycle the switching amplifier switches at most once and may not switch at all. When the input audio signal reaches a high peak, for example, the amplifier will be mostly switched "on" and will only occasionally switch "off." Electromagnetic interference is not concentrated at the switching frequency as was the case with the pulse width modulator of prior art methods; instead it is spread over a broad frequency range by the randomness of the switching times. At any given frequency, there is very little power being generated and EMI is much less of a problem than with a pulse width modulator.

The fifth step 5 of the present method is filtering the output of the amplifier. Typically, a low pass filter will be used.

The sixth step 6 of the present method is transmitting the filtered output to a transducer, such as a loudspeaker or earphone.

The seventh, and final, step 7 of the present method, if the amplitude of the received digital signal is close to zero for a user-definable period of time, turning the amplifier off.

When the input amplitude is close to zero for a sufficient amount of time, a control signal is sent to the switching amplifier to shut it off completely. This "sleep" mode preserves battery life during quiet intervals; such as between songs for an MP3 player or while no one is talking for a hearing aid.

Figure 4:
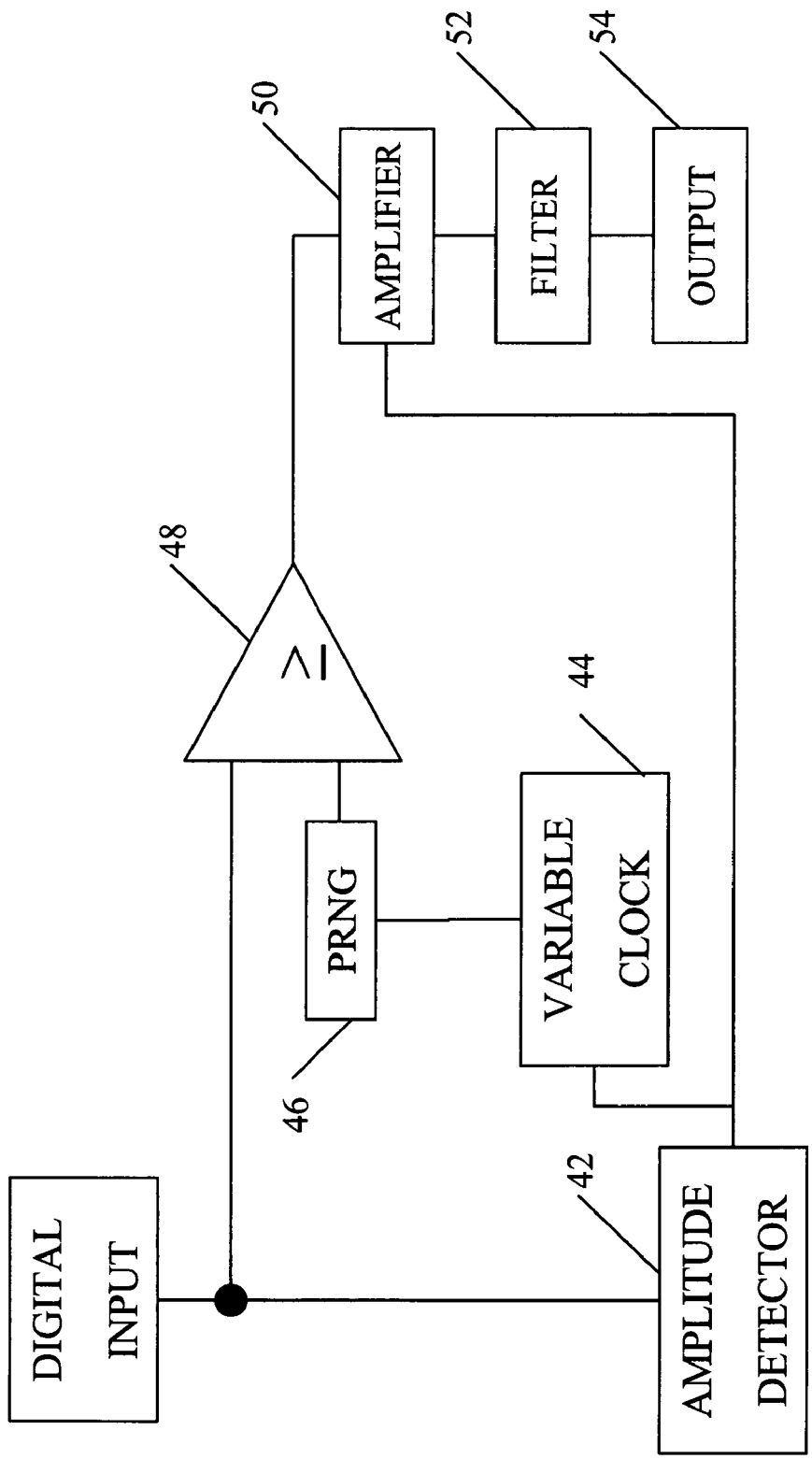
FIG. 4 is a schematic of the present invention.

FIG. 4 shows a schematic of the present invention, which embodies the method described above.

A circuit comprising the present invention has an amplitude detector 42, a variable clock 44, a pseudo-random number generator 46, a comparator 48, a power amplifier 50, a filter 52, and a transducer 54.

The amplitude detector 42 receives a digital input signal and has an input and an output. The input is connected to a digital audio signal.

The variable clock 44 has an input connected to the output of the amplitude detector 42 and an output.

A pseudo-random number generator 46 has an input connected to the output of the variable clock and an output. As noted above, as the input signal amplitude decreases, the clock rate is increased, which reduces the amount of white noise within the audio range so that it becomes imperceptible to the listener.

The pseudo-random number generator 46 and the comparator 48 form a stochastic converter, as will be known to persons skilled in the art. The comparator 48 has a first input, a second input, and an output. The second input is connected to the output of the pseudo-random number generator 46, and the first input is connected to the digital input signal.

A power amplifier 50 amplifies the signal, and has an input that is connected to the output of the comparator 48, a control input connected to the output of the amplitude detector 42, and an output.

As explained above, when the input amplitude is close to zero for a sufficient amount of time, the control signal switches the amplifier off.

To remove high frequency switching components, a filter 52 is used. The filter 52 is typically a low pass filter, although persons skilled in the art will recognize that other filter designs could be used. The cut-off frequency is user-selectable. The filter has an input connected to the output of the amplifier 50, and an output.

The output of the filter 52 is a transducer 54. The transducer 54 has an input connected to the output of the filter 52 and is typically a loudspeaker, earphone, or like device.

While the preferred embodiments of the invention have been illustrated and described, it will be apparent to those of ordinary skill in the art that various changes and modifications may be made without deviating from the inventive concepts set forth above.

What is claimed is:

1. A method of amplifying a digital signal, comprising the steps of:
    a) receiving a digital signal;
    b) generating a pseudo-random number, the pseudo-random number generated every clock cycle of a variable clock, wherein the frequency of the variable clock is varied in accordance with the average amplitude of the received digital signal;
    c) comparing the received digital signal with the pseudo-random number;
    d) if the digital signal is at least equal to the pseudo-random number, switching an amplifier on, otherwise switching the amplifier off;
    e) filtering the output of the amplifier;
    f) transmitting the filtered output to a transducer; and
    g) if the amplitude of the received digital signal is close to zero for a predefined period of time, turning the amplifier off using a control signal input to the amplifier.

2. The method of claim 1, wherein the step of filtering the output of the amplifier comprises filtering the output of the amplifier with a low pass filter.

3. A power amplifier with random switching, comprising:
    a) an amplitude detector, the amplitude detector having an input and an output, the input connected to a digital signal;
    b) a variable clock, the variable clock having an input connected to the output of the amplitude detector, and an output;
    c) a pseudo-random number generator, the pseudo-random number generator having an input connected to the output of the variable clock and an output;
    d) a comparator, the comparator having a first input, a second input, and an output, the second input connected to the output of the pseudo-random number generator, and the first input connected to the digital signal;
e) a power amplifier, the power amplifier having an input connected to the output of the comparator, and a control input connected to the output of the amplitude detector, and an output;
f) a filter, the filter having an input connected to the output of the amplifier, and an output; and
g) a transducer, the transducer having an input connected to the output of the filter.

* * * * *